United States Patent
Koifman et al.

[11] Patent Number: 5,966,087
[45] Date of Patent: Oct. 12, 1999

[54] APPARATUS PROVIDING A SUBSTANTIALLY EQUAL TRANSCONDUCTANCE RATIO AND METHOD

[75] Inventors: Vladimir Koifman, Ramat Gan; Yachin Afek, Kfar Saba; Israel Kashat, Netanya, all of Israel

[73] Assignee: Motorola, Inc., Schaumburg, Ill.

[21] Appl. No.: 09/031,196

[22] Filed: Feb. 26, 1998

[51] Int. Cl.[6] .................................................. H03M 3/00
[52] U.S. Cl. ......................... 341/155; 341/144; 341/143
[58] Field of Search ................................ 341/155, 143, 341/144; 327/73, 97; 330/252

[56] References Cited

U.S. PATENT DOCUMENTS

| | | | |
|---|---|---|---|
| 5,189,321 | 2/1993 | Seevinck | 307/490 |
| 5,223,743 | 6/1993 | Nakagawara | 307/296.1 |
| 5,311,088 | 5/1994 | Nelson | 307/520 |
| 5,408,235 | 4/1995 | Doyle et al. | 341/143 |
| 5,781,137 | 7/1998 | Knudsen | 341/118 |
| 5,793,811 | 8/1998 | Yu | 341/150 |

OTHER PUBLICATIONS

Horowitz, P., Hill, W.: "The Art of Electronics", Second Edition, Cambridge University Press, 1990, ISBN 0–521–37095–7, chapter 3.07 "FET amplifiers" on pp. 129–133.

*Primary Examiner*—Brian Young

[57] ABSTRACT

A current source (200) comprises an input bias unit (291), a transconductance unit (295), an output bias unit (292), a combiner unit (296) and a voltage source 130'. In the transconductance unit (295), a first current mirror (215) provides currents $I_A$ and $I_B$ which are distributed to cross-coupled first and second transistors arrangements (TA 3 and TA 4). The first arrangements (TA 3) receives a control signal ($V_{GS12}$) which is derived from a master signal (205') at a master terminal (205). The second arrangement (TA 4) is controlled from the first arrangement (TA 3). The transconductance ratio between the arrangements (TA 3 and TA 4) is regulated through a feedback in a second current mirror (235). A transconductance drift is substantially prevented. Output currents which are related to this stabilized transconductance ratio are provided at output terminals (203, 204). A first output current ($I_{out1}$) is derived from the second arrangement (TA 3) and a second output current ($I_{out2}$) is derived by from the master signal and from the second arrangement (TA 3).

24 Claims, 6 Drawing Sheets

APPARATUS PROVIDING A SUBSTANTIALLY EQUAL TRANSCONDUCTANCE RATIO AND METHOD

FIELD OF THE INVENTION

The present invention generally relates to electronic circuits, and, more particularly to current sources and to a method therefore.

BACKGROUND OF THE INVENTION

Modern electronic circuits often have analog and digital portions integrated on a single chip. Such circuits ("mixed-signal chips") are, for example and not intended to be limiting, analog-to-digital converter (ADCs) or digital-to-analog converters (DACs). Unwanted noise signals, such as common mode spikes can parasitically leak from digital portions to analog portions. It is well known in the art to lower the spike sensitivity of the analog portions by a differential design. This approach includes differential current sources supplying currents, for example, $I_{out1}$ and $I_{out2}$ to the electronic circuits. The magnitude of currents $I_{out1}$ and $I_{out2}$ and their ratio $I_{out1}/I_{out2}$ should be substantially temperature invariant.

The differential current sources are, preferably, implemented by transistor pairs. For example, a first transistor provides $I_{out1}$ and a second transistor provides $I_{out2}$. Field effect transistors (FETs) are often used. The transconductances $g_{m1}$ of the first transistor and $g_{m2}$ of the second transistor depend among others on the physical dimension of the transistors (e.g., channel width W and channel length L) and on the availability and mobility of charge carriers (e.g., electrons and holes). Changes of the environment temperature influence the transconductances $g_{m1}$ and $g_{m2}$ and therefore the magnitude of currents $I_{out1}$ and $I_{out2}$ as well as their relation. Such temperature influences are not wanted and should be compensated. Relations between $g_m$, W, L, the temperature and other parameters are analytically expressed by well known equations. For example, equations and more details for FETs are given in: Horowitz, P., Hill, W.: *"The Art of Electronics"*, Second Edition, Cambridge University Press, 1990, ISBN 0-521-37095-7, chapter 3.07 "FET amplifiers" on pages 129-133 [1]. One can expect that the transconductances of two non-ideal transistors differ even if the applied currents or voltages are equal.

Spikes going from the digital portion to the transistor pair should affect the differential currents in a common mode rather than in a differential mode. Temperature dependent changes of the transconductance ratio $g_{m1}/g_{m2}$ would have an unwanted effect on the response of the transistor pair to a spike at different temperatures. For example, at some temperatures, differential mode responses could prevail over common mode responses, or at different temperatures, the common mode responses prevail.

Modern manufacturing processes for electronic circuits allow one to decrease operating voltages so as to become substantially as low as transistor threshold voltages ("low voltage"). Also, the dimensions are shrunk ("deep sub-micron technology"). This lead among other things to a higher complexity of equations involving transconductances and bias voltages. Under such conditions it is difficult to predetermine the transconductances in the design process and to reproduce transconductances during manufacturing.

Prior art current sources are described in U.S. Pat. Nos. 5,408,235 to Doyle et al. (especially in FIG. 13) [2] and 5,223,743 to Nakagawara [3]. The present invention seeks to provide current sources which mitigate or avoid these and other disadvantages and limitations of the prior art.

DETAILED DESCRIPTION OF A PREFERRED EMBODIMENT

Figure 1:
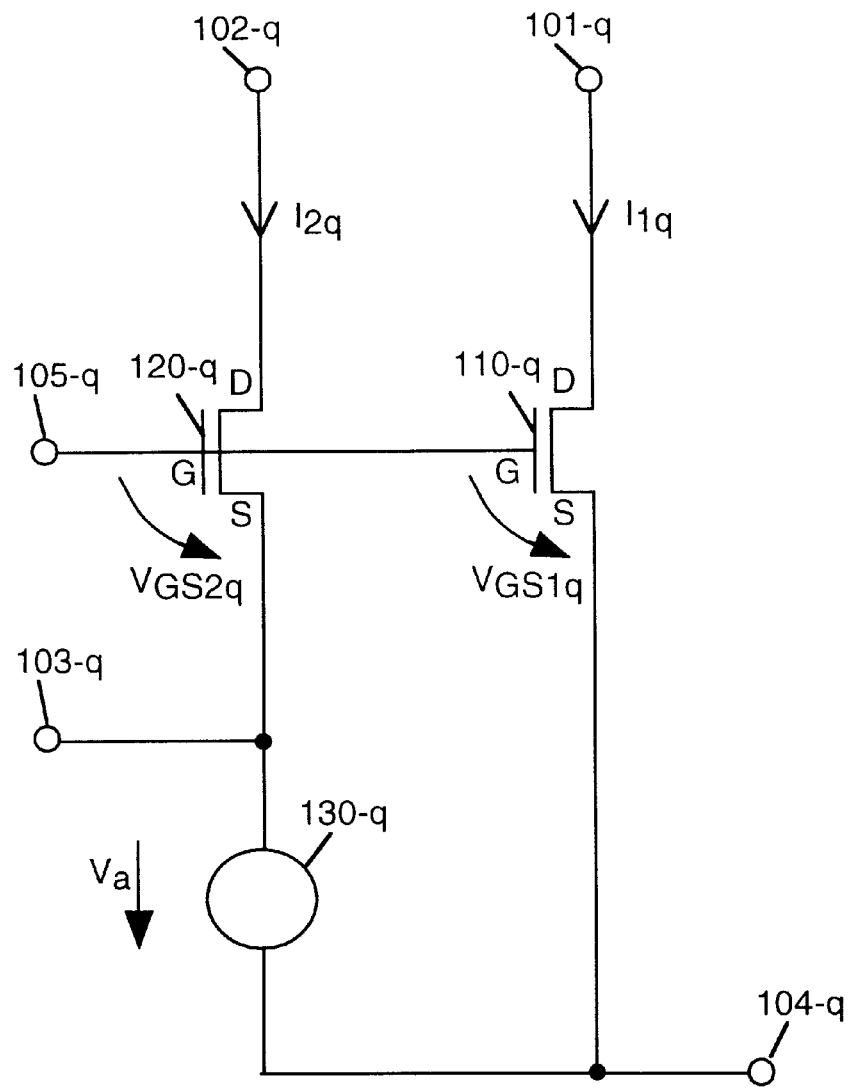
FIG. 1 is a simplified circuit diagram of a transistor arrangement according to the present invention.
Figure 2:
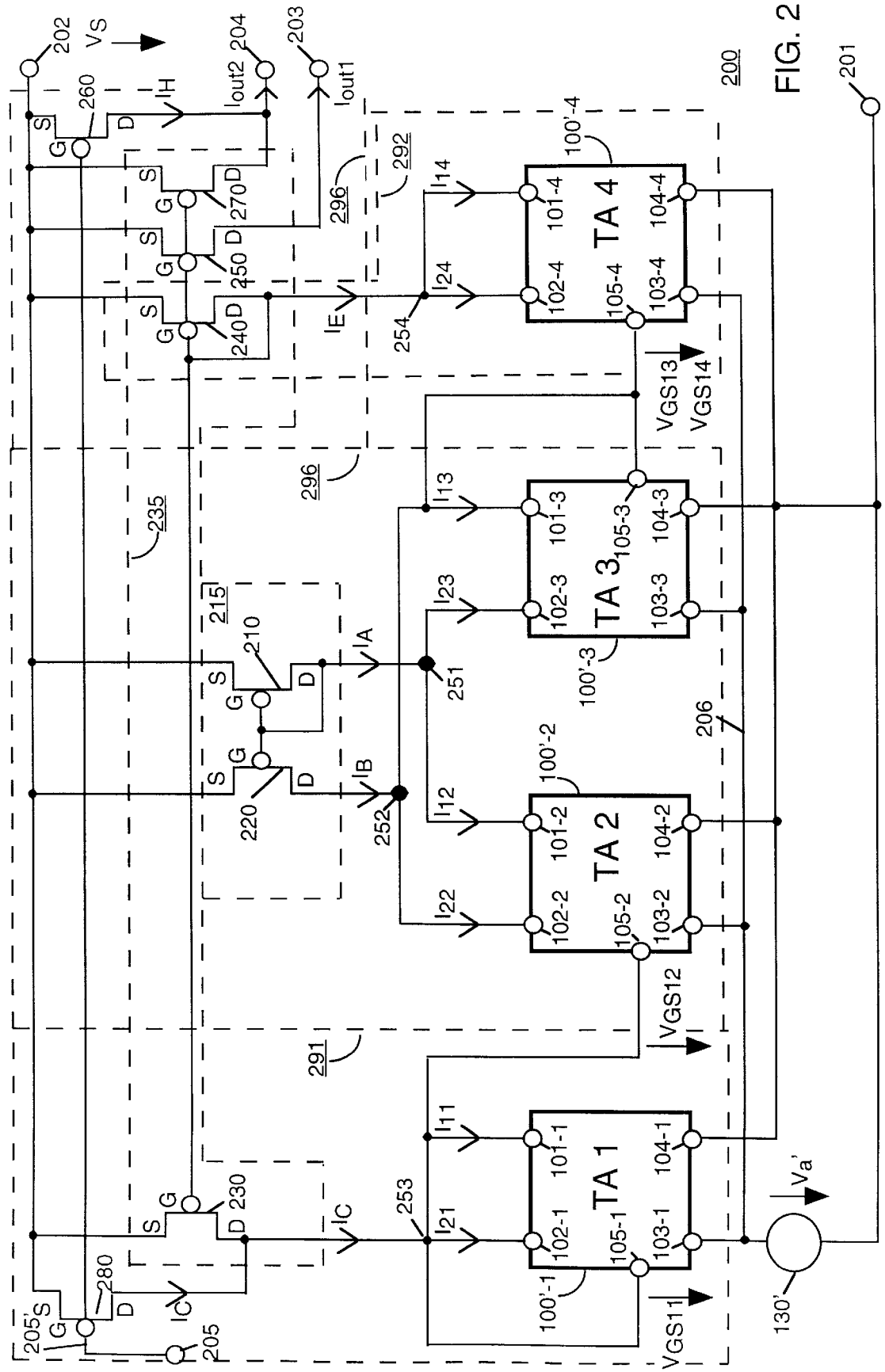
FIG. 2 is a simplified circuit diagram of a differential current source using the transistor arrangement of FIG. 1 in a preferred embodiment of the present invention.

Embodiments of the present invention are, preferably, implemented by transistors, such as, for example, transistor 110-$q$ in FIG. 1 and transistor 210 in FIG. 2. The term "transistor" is intended to include any device having at least two main electrodes and a control electrode which is controlled by a signal applied to the control electrode. Transistors are, preferably, implemented by integration in or on a semiconductor substrate.

The transistors used to implement the present invention are, preferably, field effect transistors (FET) having a source (S) and a drain (D) as main electrodes and a gate (G) as control electrode. For convenience, the abbreviations S, D and G appear also in the figures. Since FETs are typically symmetrical components, the true designation of "source" and "drain" is only possible once a voltage is impressed on the terminals. The designation of sources (S) and drains (D) herein should therefore be interpreted in the broadest sense. Transistors can also be bipolar transistors with collectors and emitters as main electrodes and bases as control electrodes, or other devices. The present invention is useful but not limited to CMOS-technology using N-channel FET ("N-FET") and P-channel FET ("P-FET"). The terms "first type" (e.g., for N-FET 110-$q$) and "second type" (e.g., for P-FET 210 in FIG. 2) are intended to distinguish complementary transistors of opposite conductivity. For convenience, the figures illustrate the gates (G) of P-FET by small circles. "First type" and "second type" can refer to either N or P channels, as the case may be.

FIG. 1 is a simplified circuit diagram of transistor arrangement 100-$q$ (TA $q$) according to the present invention. Transistor arrangement 100-$q$ comprises transistors 110-$q$ and 120-$q$ and optional voltage source 130-$q$. The drain (D) of transistor 110-$q$ is coupled to current input 101-$q$ and the source (S) of transistor 110-$q$ is coupled to node 104. The drain (D) of transistor 120-$q$ is coupled to current input 102-$q$ and the drain (D) of transistor 120-$q$ is coupled to node 103-$q$. The gates (G) of transistors 110-$q$ and 120-$q$ are coupled together and to control input 105-$q$. Voltage source 130-$q$ is coupled between nodes 103-$q$ and 104-$q$. Transistor arrangement 100-$q$ is preferably used as a building block in the differential current source illustrated in FIG. 2. Therefore, control input 105-$q$, current inputs 102-$q$ and 101-$q$ and nodes 103-$q$ and 104-$q$ are illustrated as terminals and index q stands for any integer number, such as q=1 to q=4. Voltage source 130-$q$ can be an external voltage source, but this is not essential for the present invention.

Transistors 110-$q$ and 120-$q$ are conveniently N-channels field effect transistors (N-FETs) operating in a saturation region. This is convenient, but not essential for the present invention. Those of skill in the art are able, based on the description herein to use other transistor types without departing from the scope of the present invention.

Voltage source 130-$q$ provides voltage $V_a$ between nodes 103-$q$ and 104-$q$. Voltage $V_a$ is a substantially constant voltage. Transistor arrangement 100-$q$ receives variable control voltage $V_{GS1}$ between control input 105-$q$ and node 104-$q$. Control voltage $V_{GS1}$ is the gate-source voltage of transistor 110-$q$. Transistor 120-$q$ is controlled by gate-source voltage $V_{GS2}$ between control input 105-$q$ and node 103-$q$. $V_{GS2}$ is the difference between control voltage $V_{GS1}$ and voltage $V_a$, that is:

$$V_{GS2}=V_{GS1}-V_a \tag{1}$$

For further explanation, voltage $V_{GS1}$ is considered as the control voltage of transistors 110-$q$ and 120-$q$ ($V_a$ is substantially constant).

Transistor 110-$q$ carries drain current $I_{1q}$ between current input 101-$q$ and node 104-$q$ and transistor 120-$q$ carries drains current $I_{2q}$ between current input 102-$q$ and node 104 via voltage source 130-$q$. For simplicity, currents at the transistor gates are neglected.

Preferably, the physical dimensions of transistors 110-$q$ and 120-$q$ in TA $q$ are substantially equal. For example, substantially equal channel widths of transistors 110-$q$ and 120-$q$ are collectively expressed as channel width $W_q$. Similarly, substantially equal channel lengths are referred to as $L_q$. Therefore, transistors 110-$q$ and 120-$q$ (the same $q$) have a width-to-length ratio ($W_q/L_q$ ratio) of substantially 1. As explained later, transistor arrangements TA $q$ are used as basic building blocks. The width-length ratios $W/L^{(q)}$ and $W/L^{(q')}$ of transistors belonging to arrangements TA $q$ and TA $q'$ can be different.

Transistor arrangement 100-$q$ can be modified by using additional transistors. An example is illustrated in connection with FIG. 6.

FIG. 2 is a simplified circuit diagram of differential current source 200 using transistor arrangement 100 of FIG. 1 in a preferred embodiment of the present invention. Current source 200 comprises voltage source 130', transistor arrangements 100'-$q$ (q=1 to q=4, hereinafter TA $q$) and transistors 210, 220, 230, 240, 250, 260, 270 and 280. TA $q$ (100'-$q$, prime marker) substantially correspond to transistor arrangements 100-$q$ of FIG. 1. TA $q$ of FIG. 2 do, preferably, not have voltage sources 130-$q$ in every TA $q$. Instead, voltage source 130'(FIG. 2) serves as voltage source for all TA $q$. TA 1 and TA 4 are optional components in current source 200. TA 1 is illustrated as part of input bias unit 291 (dashed frame) and TA 2 is illustrated as part of output bias unit 292. In the example of FIG. 2, input bias unit 291 comprises transistors 280, 230 and TA 1; and output bias unit 292 comprises transistor 240 and TA 4. Current mirror 215 and TA 2 and TA 3 form transconductance unit 295 (dashed frame) and transistors 240, 250 and 270 form combiner unit 296 (dashed frame). Units 291, 292, 295, and 296 are introduced for the convenience of understanding the function of current source 200 and can share elements (overlapping frames). Details for units 291, 292, 295 and 296 are explained later.

Transistors 210 and 220 form current mirror 215 (dashed enclosure); and transistors 230, 240, 250 and 270 form current mirror 235 (dashed enclosure). Current mirror 235 has the function of a feedback path. The implementation of current mirrors 215 and 235 by transistors as in FIG. 2 is intended to be only a non-limiting example for explanation purposes. Current mirrors are well known in the art. A person of skill in the art is able, based on the description herein, to use other current mirrors without departing from the scope of the invention.

Preferably, current source 200 receives a supply voltage $V_S$ between reference lines 202 and 201. Voltage source 130' provides voltage $V_a$ between reference lines 206 and 201. Reference line 206 corresponds to node 103-$q$ of transistor arrangement 100-$q$ of FIG. 1 and is therefore illustrated coupled to nodes 103-$q$ of TA $q$ (q=1 to q=4). Similarly, reference line 201 corresponds to node 104-$q$ and is coupled to nodes 103-$q$ of TA $q$ (q=1 to q=4). Current source 200 receives master signal 205' on input 205 ("master terminal") and provides differential output current $I_{out}$ with components $I_{out1}$ and $I_{out2}$ at outputs 203 and 204, respectively. For convenience, reference lines 201, 202, 206, input 205, and outputs 203 and 204 are illustrated as terminals.

Preferably, transistors 210, 220, 230, 240, 250, 260, 270, and 280 are P-channel field effect transistors (P-FETs, circle at the gates) and transistors 110-$q$ and 120-$q$ (see FIG. 1) in TA $q$ are N-channel FETs. These assumptions are convenient, but not essential. Persons of skill in the art will be able, based on the description herein to implement current source 200 with other transistor types without departing from the scope of the present invention.

The sources (S) of transistors 220, 220, 230, 240, 250, 260, 270 and 280 are coupled to reference line 202. The gates (G) of transistors 280 and 260 are coupled together to input 205. The drains (D) of transistors 280 and 230 are coupled together to node 253. Node 253 is coupled to current inputs 101-1 and 102-1 and to control input 105-1 of TA 1 and coupled control input 105-2 of TA 2. The gates (G) of transistors 210 and 220 are coupled together to the drain (D) of transistor 210. The drain (D) of transistor 210 is coupled to current input 101-2 of TA 2 and current input 102-3 of TA 3 via node 251. Similarly, the drain (D) of transistor 220 is coupled to current input 102-2 of TA 2 and current input 101-3 of TA 3 via node 252. The drain (D) of transistor 220 is also coupled to control input 105-3 of TA 3 and control input 105-4 of TA 4. The gates (G) of transistors 230, 240, 250 and 270 are coupled together to the drain (D) of transistor 240. The drain (D) of transistor 240 is coupled to current inputs 101-4 and 102-4 of TA 4 via node 254. The drain (D) of transistor 250 is coupled to output 203. The drains (D) of transistors 260 and 270 are coupled together to output 204.

Preferably, transistors 110-2 and 120-2 in TA 2 (see FIG. 1) have different physical dimensions than transistors 110-3 and 120-3 in TA 3. For example, the channel width $W_3$ of transistors 110-3 and 120-3 can be by a factor w larger than the channel width $W_2$ of transistors 110-2 and 120-2, that is:

$$W_3=w*W_2. \tag{2}$$

Factor w has preferably, a value in the range of about $1 \leq w \leq 32$, but other values, larger or smaller can also be used. Preferably, transistors 110-1 and 120-1 in TA 1 (see FIG. 1) have substantially equal dimensions as transistors 110-2 and 120-2 in TA 2. Similarly, transistors 110-4 and 120-4 in TA 4 have substantially equal dimensions as transistors 110-3 and 120-3 in TA 3. This is convenient, but not essential for the present invention.

Control voltages $V_{GS1q}$ at control inputs 105-$q$ are related to reference line 201 and indicated by down-pointing arrows. Transistors 280 and 260 provide currents $I_F$ and $I_H$, respectively, depending on master signal 205'. Input bias unit 291 and transistors 230 and 280 provide current $I_C$ to node 253. TA 1 derives control voltage $V_{GS12}$ for TA 2 from current $I_C$ in a preferably linear relation, that is:

$$V_{GS12} \sim I_C \quad (3)$$

with the symbol ~ for proportional. Current $I_C$ is split into current $I_{11}$ at current input 101-1 of TA 1 and current $I_{21}$ at current input 102-1 of TA 1. Neglecting currents to control inputs 105-1 of TA 1 and 105-2 of TA 2, this can be expressed as:

$$I_C = I_{11} + I_{21} \quad (4)$$

In output bias unit 292, transistor 240 provides current $I_E$ to node 254. TA 4 relates current $I_E$ to $V_{GS13} = V_{GS14}$ preferably, linearly, that is:

$$I_E \sim V_{GS14} \quad (5)$$

Node 254 splits $I_E$ into current $I_{14}$ at current input 101-4 of TA 4 and current $I_{24}$ at current input 102-4 of TA 4, that is:

$$I_E = I_{14} + I_{24} \quad (6)$$

Transistor 250 provides output current $I_{out1}$ to output 203. Current $I_{out1}$ depends thereby on current $I_E$ (drain-gate connection). Transistors 260 and 270 provide output current $I_{out2}$ to output 204. Current $I_{out2}$ depend on current $I_E$ and on master signal 205'. On other words, master signal 205' modulates output current $I_{out1}$.

In current mirror 216, transistor 210 provides current $I_A$ to node 252 and transistor 220 provides current $I_B$ to node 251. Current $I_A$ and $I_B$ are related by a substantially constant factor ($\chi \approx 1$) as $I_A = \chi^* I_B$. Preferably, currents $I_A$ and $I_B$ have substantial equal ($\approx$) magnitudes ($\chi \approx 1$), that is:

$$I_A \approx I_B \quad (7)$$

With the cross coupled connections from nodes 251 and 252 to the current inputs of TA 2 and TA 3, current $I_A$ partially goes to TA 2 and to TA 3 and current $I_B$ partially goes to TA 2 and to TA 3:

$$I_A = I_{12} + I_{23} \quad (8)$$

$$I_B = I_{22} + I_{13}, \quad (9)$$

wherein current $I_{12}$ goes to current input 101-2 of TA 2, current $I_{22}$ goes to current input 102-2 of TA 2, current $I_{13}$ goes to current input 101-3 of TA 3, and current $I_{23}$ goes to current input 102-3 of TA 3.

Now, differences between currents $I_{12}$ and $I_{22}$ going to TA 2 and between currents $I_{13}$ and $I_{23}$ going to TA 3 are estimated by combining Eqs. (7), (8) and (9):

$$I_{12} + I_{23} \approx I_{22} + I_{13} \quad (10)$$

$$I_{12} - I_{22} \approx I_{13} - I_{23} \quad (11)$$

With the differences on both sides of Equation (11) being substantially equal, the transconductances $G_{m2}$ and $G_{m3}$ in TA 2 and TA 3, respectively, are also substantially equal.

Current $I_C$ flowing into TA 1 has, preferably, a magnitude substantially equal to the sum of currents $I_{12}$ and $I_{22}$ which flow into TA 2, that is:

$$I_C \approx I_{12} + I_{22} \quad (12)$$

Similarly, the magnitude of current $I_E$ flowing into TA 4 is conveniently related to $I_{24}$ and $I_{14}$ as:

$$I_E \approx I_{24} + I_{14} \quad (13)$$

But this relations (12) and (13) are not essential for the present invention. Persons of skill in the art are able to scale the relations of Eqs. (12) and (13) to have, for example ($I_{12} + I_{22}$) as a fraction of $I_C$.

For example, and not intended to be limiting, current source 200 can be described as an apparatus comprising: (a) an input unit receiving master signal 205' and providing a first control signal (e.g., $V_{GS12}$); (b) current mirror 215 providing current $I_A$ and current $I_B$ which are related as $I_A = \chi^* I_B$, (preferably $I_A \approx I_B$, $\chi \approx 1$); (c) node 251 splitting current $I_A$ into a current $I_{12}$ and a current $I_{23}$ (e.g., $I_A \approx I_{12} + I_{23}$); (d) node 252 splitting current $I_B$ into a current $I_{22}$ and a current $I_{13}$ (e.g., $I_B \approx I_{22} + I_{23}$); (e) transistor 120-2 and transistor 110-2 conducting current $I_{22}$ and current $I_{12}$, respectively, to reference line 201, transistors 120-2 and 110-2 being controlled by the first control signal which determines a first common transconductance $G_{m2}$ of transistors 120-2 and 110-2; and (f) transistors 120-3 and 110-3 conducting current $I_{23}$ and current $I_{13}$, respectively, to line 201, transistors 120-3 and 110-3 being controlled by a second control signal (e.g., $V_{GS13}$) derived from current $I_{13}$ such that a second common transconductance $G_{m3}$ of transistors 120-3 and 110-3 substantially equals the first common transconductance $G_{m2}$, a transconductance drift (due to e.g., temperature changes) causing a current drift of a current difference between current $I_{23}$ and current $I_{13}$.

Conveniently, current source 200 further comprises a first network (e.g., output bias unit 292 and transistors 240 and 250 of combiner unit 296) for providing output current $I_{out1}$ depending on the current difference, for example, between current $I_{23}$ and current $I_{13}$ and a second network (e.g., transistors 260 and 270) which derives an output current $I_{out2}$ from (a), for example, master signal 205' and (b) from the current difference.

Conveniently, the first network of current source 200 provides output current $I_{out1}$ via an auxiliary signal (current $I_E$) related to current $I_{13}$ (or, optionally, to current $I_{23}$), wherein the second network receives master signal 205' and provides output current $I_{out2}$ and wherein in the second network the auxiliary signal modulates output current $I_{out2}$ (e.g., by transistor 260).

Conveniently, in current source 200, transistors 120-2 and 110-2 both have first geometrical dimensions (e.g., $W_2$) and transistors 120-3 and 110-3 both have second geometrical dimensions (e.g., $W_3$). First and second geometrical dimensions are different. For example, the $W/L_{(3)}$ ratio of transistors 110-3 and 120-3 in TA 3 is, preferably, 4 to 8 times larger than the $W/L_{(2)}$ ratio of transistors 110-2 and 120-2 in TA 2. This is convenient, but not essential for the present invention. Other relations between the W/L ratios can also be used.

A feedback circuit, for example with the feedback path of mirror 235 and TA 4, receives the current difference and modifies the first signal (which controls transistors 120-2 and 110-2).

Current source 200 can optionally comprise capacitors or similar elements coupled between the transistors to provide a stable operation. For simplicity, the capacitors are not illustrated in FIG. 2. Persons of skill in the art are able to implement such capacitors into current source 200 without a need for further explanation herein.

Figure 3:
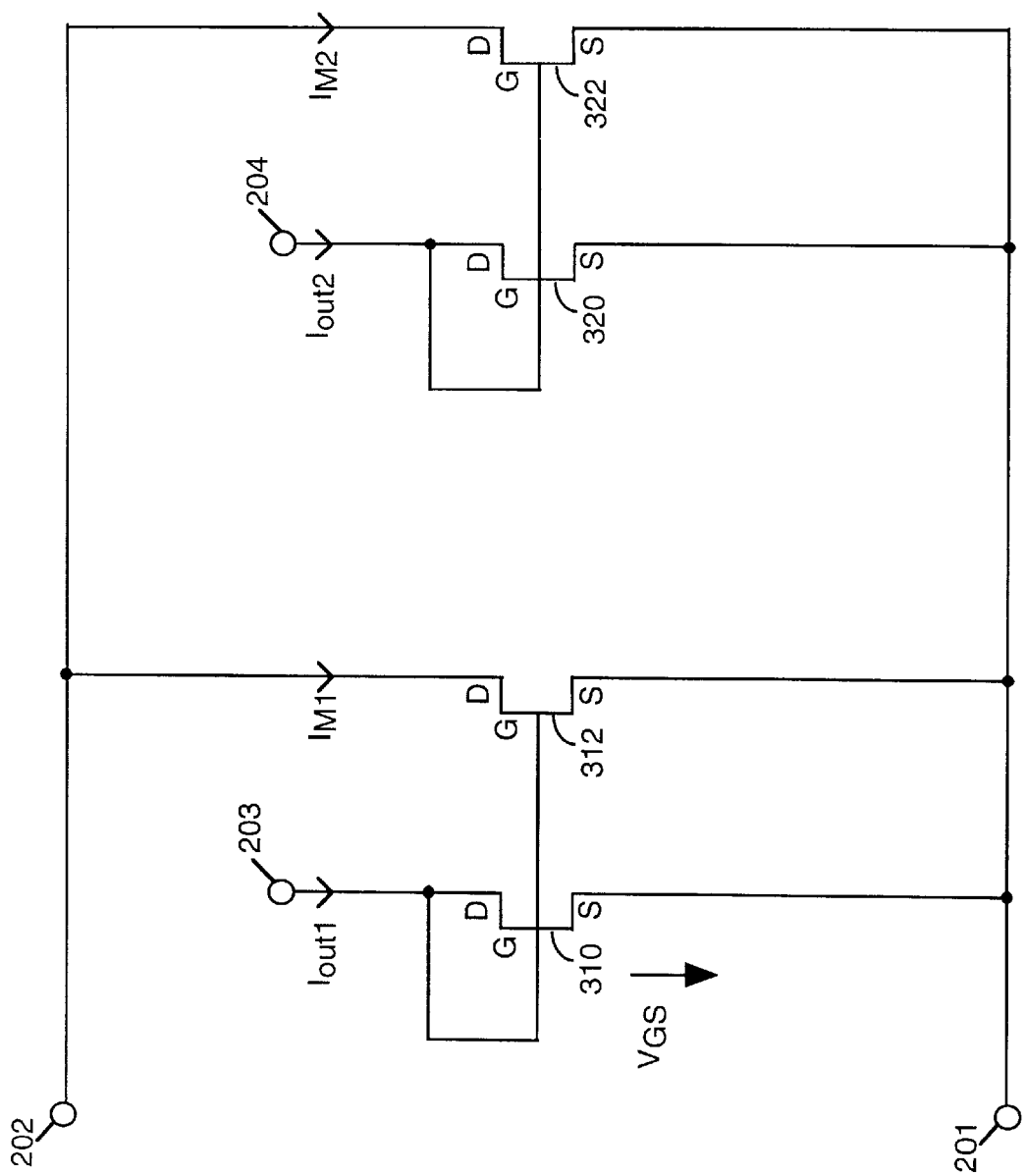
FIG. 3 is simplified circuit diagram of first and second load transistors which can be coupled to the differential current source of FIG. 2.

FIG. 3 is simplified circuit diagram of load transistors 310 and 320 which can be coupled to the differential current source 200 of FIG. 2. FIG. 3 also illustrates mirror transistors 312 and 322. Transistors 310, 312, 320 and 322 (e.g., all N-FETs) form arrangement 300. Transistor arrangement 300 is intended to be a nonlimiting example which symbolizes further circuits (e.g., ADCs, DACs, etc.). Therefore, transistor arrangement 300 can have further elements (e.g., transistors) coupled in parallel to or serially between transistors 310, 312, 320 and 322. In the example of FIG. 3, the transistors are coupled as follows: The drain (D) and the gate (G) of transistor 310 are coupled together to terminal 203 (i.e. output 203 in FIG. 2). The drain (D) of transistor 312 is coupled to line 202 (cf. FIG. 2). The sources (S) of transistors 310 and 312 are coupled to line 201 (cf. FIG. 2). The gates (G) of transistors 310 and 320 are coupled together. Similarly, the drain (D) and the gate (G) of transistor 320 are coupled together to terminal 204. The sources (S) of transistors 320 and 322 are coupled to line 201. The gates (G) of transistors 320 and 322 are coupled together.

Transistors 310 and 320 receive currents $I_{out1}$ and $I_{out2}$, respectively, from current source 200 (FIG. 2); and transistors 312 and 322 mirror these currents to mirror currents $I_{M1}$ and $I_{M2}$, respectively. The physical dimensions (W, L, W/L), of transistors 310 and 312 are conveniently, but not essentially, related to that of the transistors in TA 1 and TA 2 (see FIG. 2) and the dimensions of transistors 320 and 322 are related to TA 3 and TA 4. Preferably, the relations between the currents ($I_{out1}$, $I_{M1}$, through transistors 310, 312) and $W/L^{(3,4)}$ (TA 3 and TA 4) are substantially equal to the relations between the currents ($I_{Iout2}$, $I_{M2}$, through transistors 320, 322) and $W/L^{(1,2)}$ (TA 1, TA 2).

Figure 4:
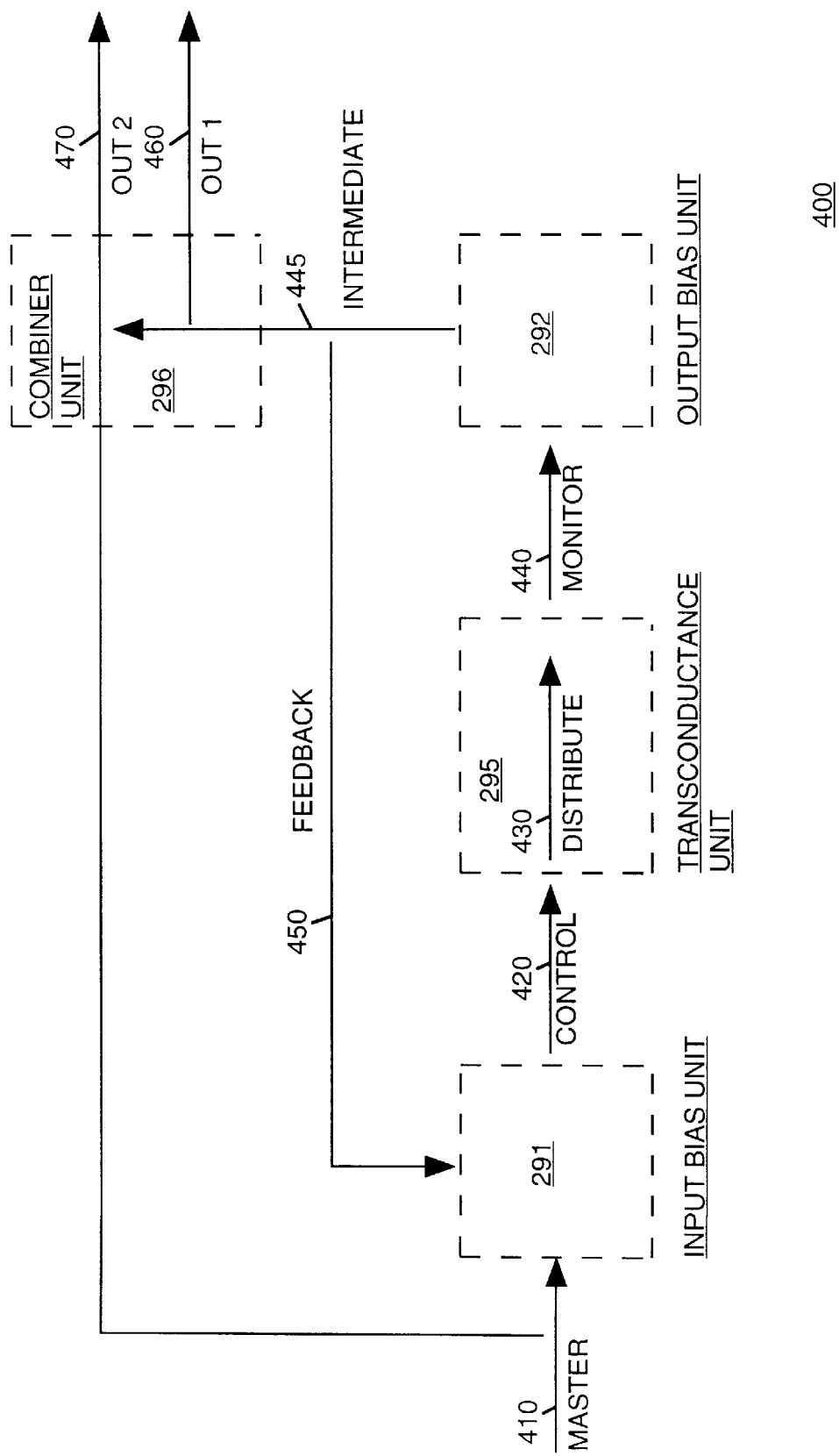
FIG. 4 is a simplified signal flow diagram of the current source of FIG. 2 for illustrating a method of the present invention.

FIG. 4 is a simplified signal flow diagram of current source 200 for illustrating method 400 of the present invention. By dashed frames, FIG. 4 illustrates input bias unit 291, transconductance unit 295, output bias unit 292, and combiner unit 296. Arrows 410, 420, 430, 440, 450, 445, 460, and 470 illustrate method steps by symbolically presenting the interactions between units 291, 292, 295 and 296. For convenience of explanation, the method steps are described as being performed consecutively. It is, however, intended that the method steps are performed continuously and in parallel. Method 400 is a method for regulating the transconductances in first, second, third, and fourth transistors (e.g., transistors 110-2, 120-3, 120-3, 120-3, respectively). Preferably, method 400 is performed as follows:

Step 410 (arrow 410 "MASTER" pointing to unit 291): Receiving a master signal by input bias unit 291 (e.g., signal 205' gate (G) of transistor 280);

Step 420 (arrow "CONTROL" between units 291 and 295): Deriving a first control signal for transconductance unit 296 (e.g., voltage $V_{GS12}$ at input 105-2 of TA 2) from the master signal;

Step 430 (arrow "DISTRIBUTE" within unit 296): Distributing a first current (e.g., $I_A$) to the first transistor (e.g., 110-2) as a first partial current (e.g., $I_{12}$) and to the second transistor (e.g., 120-3) as a second partial current (e.g., $I_{23}$) and distributing a second current (e.g., $I_B$) to the third transistor (e.g., 110-3) as a third partial current (e.g., $I_{13}$) and to the fourth transistor (e.g., 1202) as a fourth partial current (e.g., $I_{22}$), thereby controlling the first and fourth transistors by the first control signal and controlling the second and third transistor by a second control signal (e.g., $V_{GS13}$) derived from the third partial current, such that a transconductance ratio (e.g., $G_{m2}/G_{m3}$) between the first and fourth transistors and the second and third transistors is established;

Steps 440 and 445 (arrow "MONITOR" from unit 296 to unit 292 and arrow "INTERMEDIATE"): Monitoring changes of the transconductance ratio $G_{m2}/G_{m3}$ in unit 295 by output bias unit 292 through changes of one of the third partial current (e.g., change of $I_{13}$), thereby providing (445) an intermediate signal (e.g., current $I_E$ by output bias unit 292); and Step 450 (arrow "FEEDBACK" from unit 292 to unit 291): Providing a feedback from output bias unit 292 to input bias unit 291 and modifying the first control signal (e.g., changing $I_E$ acting on gates (G) of transistors 240 and 230 of current mirror 235 in the feedback path, changing $I_C$ and $V_{GS12}$) according to the intermediate signal;

Method 400 can comprise additional steps: step 460 (arrow "OUT 1" as continuation of arrow 445) providing a first output signal (e.g., $I_{out1}$ by transistor 250) from the intermediate signal (e.g., $I_E$); and step 470 (arrow "OUT 2" from "MASTER" through unit 296) providing a second output signal (e.g., $I_{out2}$) by combining the intermediate signal with the master signal (e.g., transistors 270 and 260).

Further details for the method of the present invention are as follows: In step 410, the master signal controls current $I_F$ (transistor 280) which is combined with the drain current of transistor 230. In step 430, the transconductance ratio $G_{m2}/G_{m3}$ is, preferably: $G_{m2} \approx G_{m3}$. Also, in step 430, a current balance $I_A \approx I_B$ is conveniently established.

It is an advantage of the present invention that current source 200 provides transconductance ratios which are substantially temperature invariant. The behavior of current source 200 of the present invention has been simulated. The simulation method was SPICE which is well known in the art. Other methods can also be used to obtain similar results. In a temperature range between minus 60 degrees Celsius and plus 150 degrees Celsius, the transconductances ratio $G_{m2}/G_{m3}$ changed only by about 3 percent.

Figure 5:
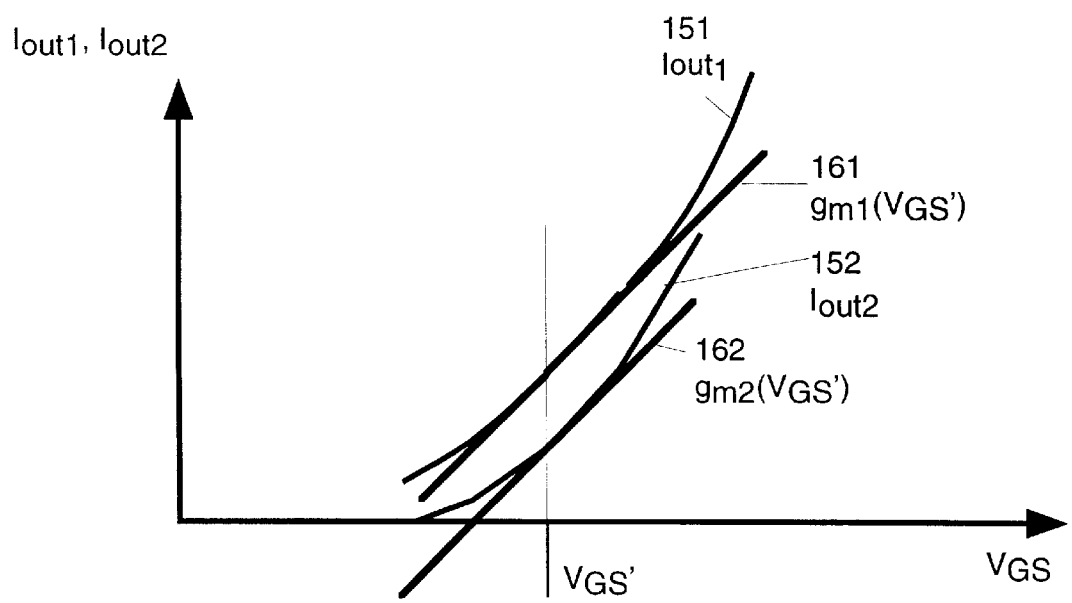
FIG. 5 is a simplified current-voltage diagram of first and second load transistors of FIG. 3.

FIG. 5 is a simplified current-voltage diagram of transistors 310 and 320 in transistor arrangement 300 of FIG. 3. The diagram illustrates magnitudes of currents $I_{out1}$ and $I_{out2}$ an a vertical axis and illustrates control voltage $V_{GS}$ on a horizontal axis. Traces 151 and 152 illustrate the functions f ($V_{GS}$) of currents $I_{out1}$ and $I_{out2}$, respectively, by way of a nonlimiting example, these are:

$$I_{out1} = f(V_{GS}) \text{ (trace 151)} \tag{14}$$

$$I_{out2} = f(V_{GS}) \text{ (trace 152)} \tag{15}$$

Traces 161 and 162 illustrate transconductances $g_{m1}$ ($V_{GS}$) of transistor 310 and $g_{m2}$ ($V_{GS1}$) of transistor 320 respectively). Transconductances are commonly defined as the differentiations ("d . . . /d . . . ") of the currents I (collectively for $I_{out1}$ and $I_{out2}$) with respect to the control voltage $V_{GS}$. In other words, traces 161 and 162 are tangents to traces 151 and 152, illustrating:

$$g_m = dI/dV_{GS} \text{(general definition)} \tag{16}$$

$$g_{m1} = dI_{out1}/dV_{GS} \text{(trace 161 for value } V_{GS} = V_{GS}\text{')} \tag{17}$$

$$g_{m2} = dI_{out2}/dV_{GS} \text{(trace 162 for value } V_{GS} = V_{GS}\text{')} \tag{18}$$

In the example of FIG. 5, traces 161 and 162 are substantially parallel, thus indicating substantially equal ($\approx$) transconductances of transistors 310 and 320, that is:

$$g_{m1}(V_{GS}') \approx g_{m2}(V_{GS1}) \approx G_m, \tag{19}$$

wherein $G_m$ is a common transconductance of transistors 310 and 320. The control voltage $V_{GS}$ has the value $V_{GS}$'. The common transconductance $G_m$ is convenient for the present invention, but not essential. In general, conductances $g_{m1}$ and $g_{m2}$ (the current-to-voltage differentiations) can be related by a substantially constant transconductance ratio $\gamma$ which as can be defined as:

$$\gamma = g_{m1}(V_{GS}')/g_{m2}(V_{GS}') \qquad (20)$$

with the slash / for division. For simplicity, the ratio $\gamma$ is assumed to be $\gamma \approx 1$, thus using the common transconductance $G_{mq}$ of Equation (19). Persons of skill in the art are able, based on the description herein, to practice the present invention for ratios $\gamma \neq 1$, without the need for further explanations.

Figure 6:
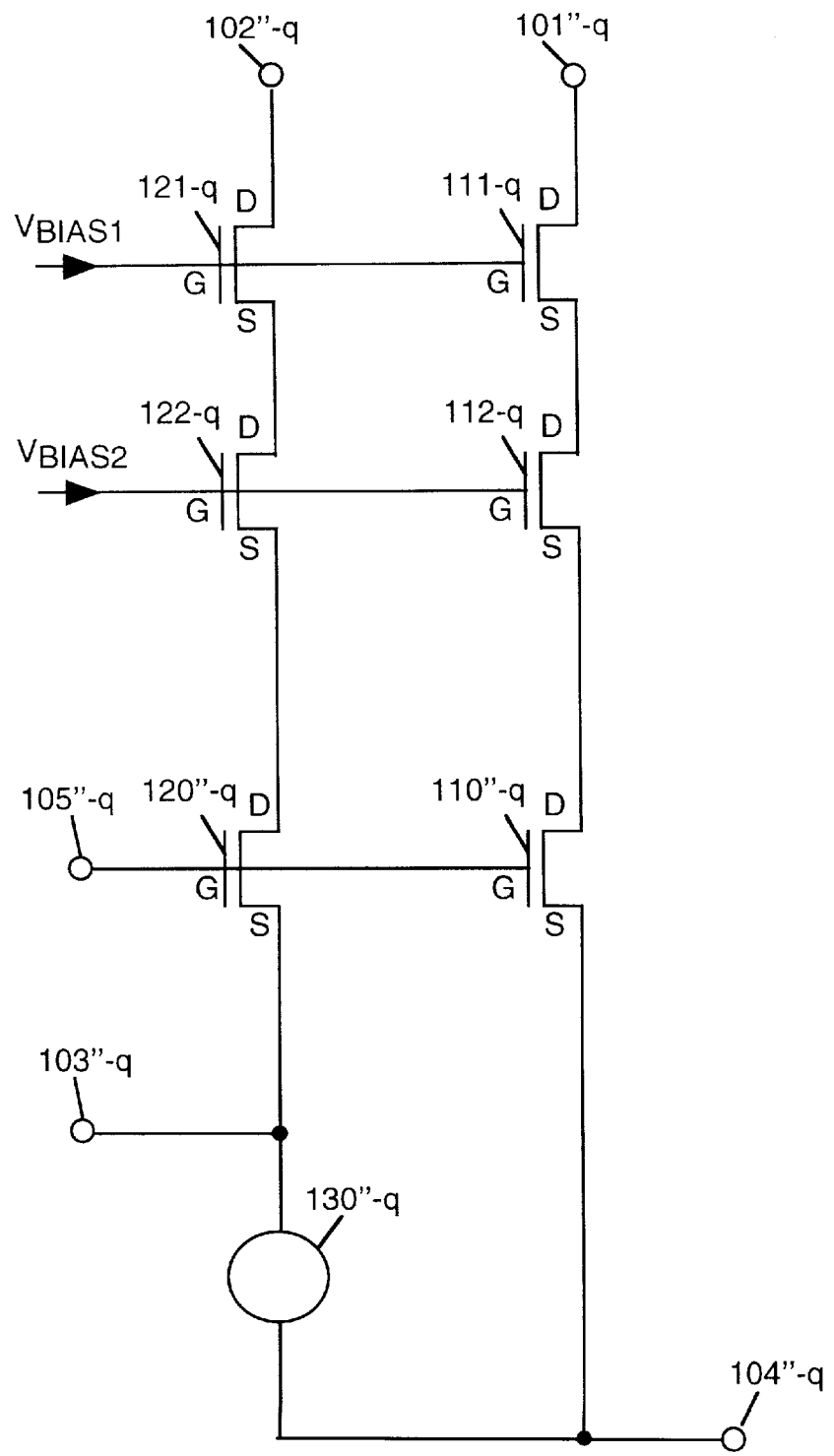
FIG. 6 is a simplified circuit diagram of a further transistor arrangement according to a further embodiment of the invention.

FIG. 6 is a simplified circuit diagram of transistor arrangement 100"-$q$ according to a further embodiment of the present invention. Reference numbers 110-$q$/110"-$q$, 120-$q$/120"-$q$, 100-$q$/101"-$q$, . . . , 105-$q$/105"-$q$ and 130-$q$/130"-$q$ stand for analogous elements in FIG. 1 and FIG. 6. Transistor arrangement 100"-$q$ further comprises cascode transistors 111-$q$ and 112-$q$ serially coupled between current input 101"-$q$ and the drain (D) of transistor 110"-$q$ and cascode transistors 121-$q$ and 122-$q$ serially coupled between current input 102"-$q$ and the drain (D) of transistor 120"-$q$. Transistors 111-$q$, 112-$q$, 121-$q$ and 122-$q$ are, preferably, of the same transistor type as transistors 110"-$q$ and 120"-$q$ (e.g., N-FETs). In FIG. 6, a total number of 4 cascode transistors is illustrated only by way of nonlimiting example. Persons of skill in the art are able, based on the description herein, to implement similar transistor arrangements with more or with less cascode transistors. At their gates (G), transistors 111-$q$ and 121-$q$ receive a bias voltage $V_{BIAS1}$ and transistors 112-$q$ and 122-$q$ receive a bias voltage $V_{BIAS2}$. Transistor biasing is well known in the art. Transistor arrangement 100"-$q$ can be used with or without optional current source 130"-$q$ as arrangement TA $q$ in current source 200 of FIG. 2.

Transistors 111-$q$, 112-$q$, 121-$q$ and 122-$q$ can operate in the linear region or, more conveniently, in the saturation region. Transistors 111-$q$, 112-$q$, 121 -$q$ and 122-$q$ provide voltage drops across their drain-source (D-S) paths so that transistors 110"-$q$ and 120"-$q$ operate in saturation region.

Current sources (e.g., source 200) of the present invention using transistor arrangement 100 can be used in low voltage circuits (e.g., 0.8 volts to 0.9 volts supply voltage) and circuits in deep sub-micron technologies. Due to the substantially equal transconductances (e.g., $G_{m2}$ and $G_{m3}$) which are obtained in the current source, spike responses are substantially common mode responses and be tolerated. Unwanted differential mode responses occur to a lesser extent. Thereby, current sources of the present invention contribute to an improved spike insensitivity. The accuracy is improved and manufacturing costs can be saved. This features can have an important impact, for example, on the growing telecommunication market.

Current sources according to the present invention can be implemented in a variety of technologies, such as an example and not intended to be limiting in standard technologies such as CMOS, GCMOS, SOI and others.

While the invention has been described in terms of particular structures, devices and methods, those of skill in the art will understand based on the description herein that it is not limited merely to such examples and that the full scope of the invention is properly determined by the claims that follow.

We claim:

1. An apparatus, comprising:
    a voltage source for providing a substantially constant first voltage between a first node and a second node;
    a control input for receiving a second voltage between said control input and said second node;
    a first transistor having a first electrode coupled to a first current input, a second electrode coupled to said second node, and a third electrode coupled to said control input, said first transistor conducting a first current according to said second voltage; and
    a second transistor having a first electrode coupled to a second current input, a second electrode coupled to said first node, and a third electrode coupled to said control input for receiving said first control signal, said second transistor conducting a second current according to a difference between said second voltage and said first voltage, said first voltage having such a value that a differentiation of said first current to said second voltage and a differentiation of said second current to said second voltage are in a substantially constant ratio.

2. The apparatus of claim 1 wherein said ratio is substantially equal to 1.

3. The apparatus of claim 1 wherein the difference of the magnitudes of said first and second currents is a measure of said differentiations of said first and second currents.

4. The apparatus of claim 1 wherein said first transistor and said second transistor are field effect transistors (FETs) having drains, sources and gates as first, second and third electrodes, respectively.

5. The apparatus of claim 1 wherein said first transistor and said second transistor are N-channel FETs.

6. The apparatus of claim 1 wherein said differentiations of said first and second currents are transconductances of said first and second transistors.

7. The apparatus of claim 3 further comprising a combiner unit for providing a first output current which depends on said second voltage and a second output current which depends on said second voltage and said difference of the magnitudes of said first and second currents.

8. The apparatus of claim 3 further comprising a feedback path which provides a feedback from said current difference to said second voltage.

9. An apparatus comprising:
    a master terminal for receiving a master signal;
    a network coupled to said master terminal for deriving a first control signal depending on said master signal;
    a first current mirror providing a first current to a first node and a second current to a second node, said first and second currents being related by a substantially constant factor, said first current mirror deriving a second control signal from said first current;
    a transistor arrangement with first, second, third, and fourth transistors, each transistor having first and second main electrodes and a control electrode, first main electrodes of said first and fourth transistor coupled to said first node, first main electrodes of said second and third transistor coupled to said second node, said second main electrodes of said first and third transistors coupled to a first reference line, second main electrodes of said second and fourth transistors coupled to a second reference line, said control electrodes of said first and second transistor receiving said first control signal and said control electrodes of said third and fourth transistors receiving said second control signal.

10. The apparatus of claim 9 wherein said current mirror provides said first and second currents with substantially equal magnitude.

11. The apparatus of claim 9 wherein a first output signal is derived from said master signal and a second output signal is derived at one of said first or second nodes, said second output signal depending on an substantially equal transconductances of said first, second, third and fourth transistors.

12. An apparatus comprising:

an input unit receiving a master signal and providing a first control signal;

a current mirror providing a current $I_A$ and a current $I_B$;

a first node splitting current $I_A$ into a current $I_{12}$ and a current $I_{23}$: $I_A \approx I_{12}+I_{23}$;

a second node splitting current $I_B$ into a current $I_{22}$ and a current $I_{13}$: $I_B \approx I_{22}+I_{23}$;

first and second transistors conducting current $I_{22}$ and current $I_{12}$, respectively, to a reference line, said first and second transistors being controlled by said first control signal which determines a first common transconductance of said first and second transistors;

third and fourth transistors conducting current $I_{23}$ and current $I_{13}$, respectively, to said reference line, said third and fourth transistors being controlled by a second control signal derived from current $I_{13}$ such that a second common transconductance of said third and fourth transistors substantially equals said first transconductance, a transconductance drift causing a current drift of a current difference between current $I_{23}$ and current $I_{13}$.

13. The apparatus of claim 12 wherein $I_A \approx I_B$.

14. The apparatus of claim 12 further comprising a first network for providing a first output current depending on said current difference.

15. The apparatus of claim 12 further comprising a second network which derives a second output current from said master signal and from said current difference.

16. The apparatus of claim 12 wherein said first network provides said first output via an auxiliary signal related to current $I_{13}$ or to current $I_{23}$, wherein a second network receives said master signal and provides a second output current, and wherein in said second network said auxiliary signal modulates said second output current.

17. The apparatus of claim 12 wherein said first and second transistors both have first geometrical dimensions and said third and fourth transistors both have second geometrical dimensions, said first and second geometrical dimensions being different.

18. The apparatus of claim 12 wherein a feedback circuit receives said current difference and modifies said first control signal.

19. The apparatus of claim 12 further comprising (a) a first network for providing a first output current depending on said current difference;

(b) a second network which derives a second output current from said master signal and from said current difference; and (c) a transistor arrangement which mirrors said first and second output currents.

20. A method for regulating the transconductances in first, second, third, and fourth transistors, said method comprising the steps of:

receiving a master signal;

deriving a first control signal from said master signal;

distributing a first current to said first transistor as a first partial current and to said second transistor as a second partial current and distributing a second current to said third transistor as a third partial current and to said fourth transistor as a fourth partial current, thereby controlling said first and fourth transistors by said first control signal and controlling said second and third transistors by a second control signal derived from said third partial current, such that a transconductance ratio between said first and fourth transistors and said second and third transistors is established;

monitoring changes in said transconductance ratio through changes of said third current and providing an intermediate signal; and providing a feedback by modifying said first control signal according to said intermediate signal.

21. The method of claim 20 further comprising the following steps:

providing a first output signal from said intermediate signal; and providing a second output signal by combining said intermediate signal with said master signal.

22. An apparatus comprising:

first, second and third reference lines, wherein a voltage source is coupled between said second and third reference lines;

a current mirror coupled to said first reference line and to first and second nodes;

first, second, third and fourth transistors, each having first and second electrodes, said first and second transistors having said first electrodes coupled to said first node, said third and fourth transistors having said first electrodes coupled to said second node, said second and third transistors having said second electrodes coupled to said second reference line, and said first and fourth transistors having said second electrodes coupled to said third reference line, wherein said current mirror providing that first and second currents between said first reference line and said first and second nodes, respectively, have substantially equal magnitudes so that transconductances of said first, second, third and fourth transistors are substantially equal and that changes in said transconductances are expressed by changes in currents through said transistors.

23. The apparatus of claim 22 wherein (a) said first, second, third and fourth transistors each have control electrodes, (b) said control electrodes of said first and third transistors are coupled together to receive an input signal, (c) said control electrodes of said second and fourth transistors are coupled together to receive a control signal derived from said first node, and (d) a first output signal is derived from said input signal and a second output signal is derived from said first node.

24. The apparatus of claim 22 wherein said first, second, third, and fourth transistors are field effect transistors (FETs) with drains as first electrodes and sources as second electrodes.

* * * * *